METHOD FOR MANUFACTURING CERAMIC SUBSTRATES FOR ELECTRICAL CIRCUITS

Filed Feb. 3, 1966

INVENTORS
Don L. Lockwood &
Damon S. Paulley
BY
Barnard, McGlynn & Reising
ATTORNEYS United States Patent Office 3,324,212
Patented June 6, 1967

3,324,212

METHOD FOR MANUFACTURING CERAMIC SUBSTRATES FOR ELECTRICAL CIRCUITS

Damon S. Paulley, Conifer, and Don L. Lockwood, Boulder, Colo., assignors to Coors Porcelain Company, Golden, Colo., a corporation of Colorado Filed Feb. 3, 1966, Ser. No. 524,730
3 Claims. (Cl. 264—63)

The subject matter of the present invention is an improved method for manufacturing ceramic substrates for electrical circuits and the like.

It is common practice to use a thin ceramic plate or substrate for printed circuits, integrated circuits and other electronic components. To obtain optimum production efficiency it is frequently desirable to print a plurality of individual spaced circuits on the ceramic substrate and then divide the substrate so as to separate the printed circuits thereby forming a plurality of individual printed circuit plates. The problem has been one of accomplishing a thin ceramic substrate which is easily divisible along predetermined lines into smooth-edge individual plates while at the same time having the necessary strength to assure against premature division of the substrate during manufacture thereof or during shipping or during the circuit printing operation. The present invention solves this problem.

In accordance with the invention the thin ceramic substrate is formed with narrow V-shaped grooves to provide frangible lines for subsequent division of the substrate into individual plates after the circuit printing operation, the depth of the grooves and the angle between the sides thereof being controlled within certain limits, as hereinafter specified, whereby the substrate has ample strength to assure against premature breakage while being easily divisible into individual smooth-edged plates after the circuit printing operation.

The invention and preferred embodiments thereof will be herein described in detail with reference to the accompanying drawings in which.

Figure 1:
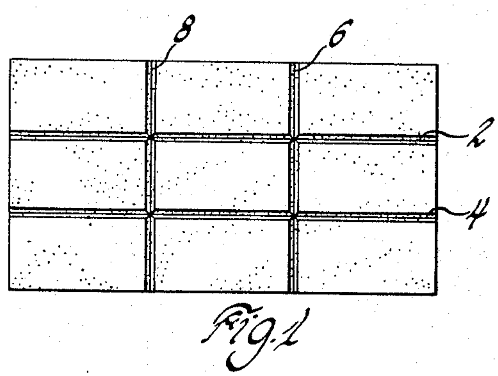
FIGURE 1 is a top plan view of a ceramic substrate made in accordance with the invention.
Figure 2:
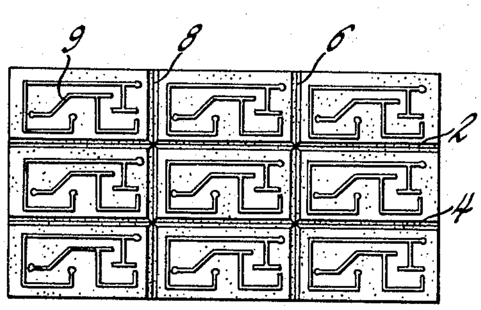
FIGURE 2 is a top plan view of the substrate shown in FIGURE 1 but after circuits have been printed thereon.
Figure 3:
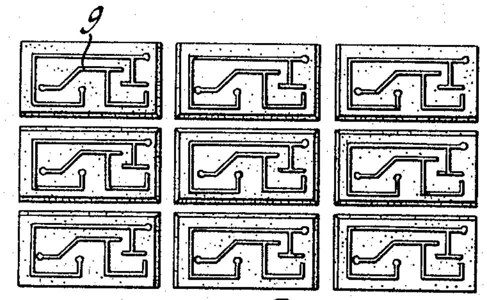
FIGURE 3 is a top plan view of the substrate and printed circuits shown in FIGURE 2 but after the substrate has been divided into individual printed circuit plates.

Referring now to the drawings, FIGURES 1, 2 and 3 illustrate the overall object and operation of the invention in accomplishing efficient production of printed circuit plates with a ceramic base or substrate. FIGURE 1 shows a ceramic substrate in the form of a thin plate and with grooves 2, 4, 6 and 8 in the top surface thereof forming frangible sections whereby the substrate can be divided into nine individual substrate plates. FIGURE 2 shows the substrate after the printed circuits have been printed thereon, an individual circuit 9 being printed on each of the nine substrate portions formed by the grooves. FIGURE 3 shows the substrate after it has been divided into the nine individual printed circuit plates. It will be understood, of course, that the particular substrate shown and the arrangement of grooves thereon is merely illustrative and any of a number of other groove arrangements could be used, if desired, to provide frangibility of the substrate into separate plates. For example, instead of grooves in two directions at right angles to each other, all of the grooves could be transverse to the longitudinal axis of the substrate, like grooves 6 and 8. Other possible arrangements will be manifest, the size and precise shape of the individual plates into which the substrate is divisible not being significant to the practice of the invention. Also, the precise technique used for printing of the circuits onto the ceramic substrate is not a significant feature of the invention; any of the well-known circuit printing techniques currently in use, such as silk screening, being satisfactory. The circuits printed on the individual substrate portions, defined by the grooves, can be the same or can differ from each other as desired. In the embodiment shown the circuits are printed on the top or grooved face of the substrate; however, the circuits can, if desired, be printed on the opposite face. Often for example, the back face is glazed for reception of the printed circuit on the back face and at times it will be desired to print circuits on both faces of the substrate whereby a single plate carries two circuits.

As alluded to above, the major problem involved in such a production method is to accomplish a substrate which is frangible into smooth-edged individual plates of predetermined size and shape and yet with sufficient strength to prevent premature breakage of the substrate into the individual plates. The key feature of the present invention is that it solves this problem by the substrate structure, and method for making same, as will now be described.

Figure 4:
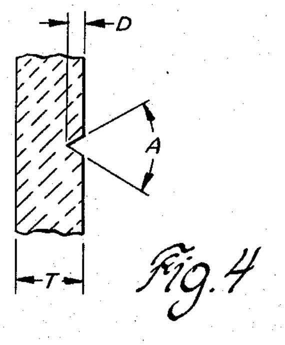
FIGURE 4 is a fragmentary enlarged sectional view taken on the line 4—4 of FIGURE 1.

Important features of the substrate structure in accomplishing the aforesaid can be seen by reference to FIGURE 4. That is, in accordance with the invention the thickness T of the substrate should be from .005 inch to .04 inch, the depth D of the grooves should be from 15% to 40% of the thickness T, and the angle A between the sides of the V-shaped grooves should be from 40° to 75°. Where there is a choice of substrate thickness (frequently the thickness of the substrate will be dictated by the particular use to be made of the printed circuit plate) it is desirable to use a thickness of about .01 inch to .03 inch. The significance of these various limits can best be discussed after description of the method whereby the substrate is manufactured since various of the factors involved relate to the method aspect of the invention.

Figure 5:
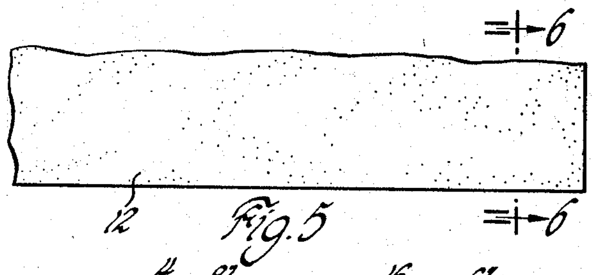
FIGURE 5 is a top plan fragmentary view of the ceramic substrate during one of the steps in manufacture thereof and prior to forming the grooves therein.
Figure 6:
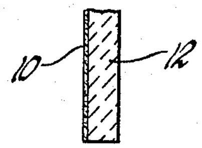
FIGURE 6 is a sectional view taken on the line 6—6 of FIGURE 4.

In the preferred method for manufacturing the substrate, the first step comprises forming a uniform mixture of organic binder and finely divided ceramic which mixture is then extruded, cast or otherwise suitably formed into a thin sheet, usually in the form of a ribbon, of the binder-ceramic mixture. For ease in handling the sheet it is desirable that it be provided with a thin backing of paper, organic plastic or the like, which backing can be removed just prior to the firing operation, hereinafter described, or can be allowed to burn out or vaporize during the firing operation, the former being preferred. FIGURE 5 shows a portion of a sheet, in the form of a ribbon, of the ceramic-organic binder mixture and FIGURE 6 illustrates the thin flexible backing 10 for the ceramic-organic binder sheet 12.

Figure 7:
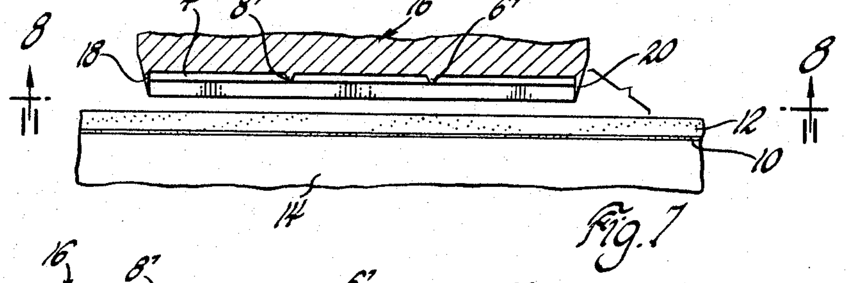
FIGURE 7 is a side view partially in section showing apparatus whereby the substrate shown in FIGURE 1 is manufactured.
Figure 8:
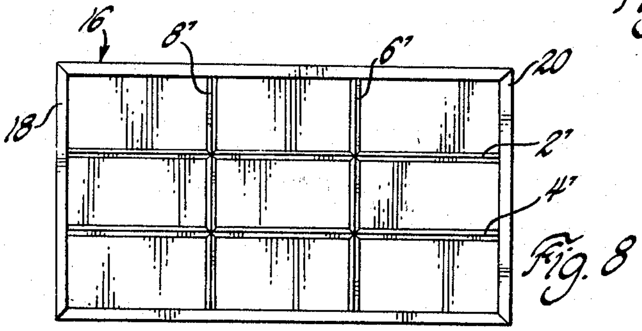
FIGURE 8 is a fragmentary view taken on the line 8—8 of FIGURE 7.

As the next step in the process, the aforedescribed sheet is stamped with a shaping and cutting tool as shown in FIGURE 7. That is, the sheet 12 with its thin backing 10 is placed on a flat surface 14, with the backing against the surface, and a tool 16 is pressed against the sheet. The tool 16 has peripheral sharp edge portions 18 and 20 which extend downwardly from the body of the tool sufficiently to cut through the sheet 10 when the tool is pressed against the sheet. Where the sheet is in the form of a ribbon such that the side edges of the ribbon constitute the side edges of the substrate being formed, it is only essential that the cutting edges be provided on the opposed ends of the tool extending transversely across the ribbon; however, to attain optimum control of edge shape and dimensions it is always preferable that the sheet be of greater width and length than the tool and with the cutting edge being continuous and extending around the periphery of the tool as illustrated in FIGURE 7. The backing 10 in addition to serving as a convenient carrier for the sheet 12 also serves the purpose of providing a relatively soft surface for contact with the cutting edge as it cuts through the sheet 10. Hence, the cutting edge can be of slightly greater depth than the thickness of the sheet 12 and yet with assurance against damage to the cutting edge when it bottoms during the cutting operation.

The bottom or working surface of the tool 16 is also provided with ribs 2′ 4′ 6′ and 8′ which form the grooves 2, 4, 6 and 8 in the sheet when the tool is pressed thereagainst. These groove-forming ribs are of V-shaped section and their depth and the angle subtended between the sides of the V are, of course, such as to provide dimensions for the grooves within the limitations described above, taking into account shrinkage of the sheet as occurs during the firing operation hereinafter described. In practice, the angle between the sides of the groove-forming ribs can be the same as the angle desired between the sides of the groove in the fired plate since shrinkage during firing does not significantly affect the shape of the groove. However, shrinkage during firing will generally result in a reduction in plate thickness and in groove depth, generally on the order of about a 10% to 30% reduction, and this should be taken into account in determining the desired thickness for sheet 10 and for the depth of the groove-forming ribs keeping in mind that the limitations set forth above, with reference to FIGURE 4, are for the finished ceramic substrate after the firing operation. If it is desired to produce substrate plates with openings therethrough, the tool 16 can of course be provided with suitable raised cutting portions to punch out the openings, where desired, during the cutting and grooving operation.

The product of the forming and cutting operation shown in FIGURE 7 will be similar to the substrate shown in FIGURE 1 though of slightly greater dimensions. Such product is next fired in a suitable kiln, preferably after removal of the backing 10, at a suitable temperature to first burn out or vaporize the organic binder and then sinter or vitrify the ceramic. The fired ceramic substrates are then ready for processing into printed circuit electronic components as described above with reference to FIGURES 1–3, though it will sometimes be required to provide a glaze surface on one or both surfaces as alluded to above.

The following will serve to provide additional details for optimum practice of the invention.

Any of a variety of ceramics can be used though the ceramic should be such as to provide good mechanical strength and also good electrical insulative characteristics for use as substrates for electronic components. High alumina ceramic having a modulus of rupture upwards of 45,000 p.s.i. is preferred. Typical compositions are: 100% alumina; 99.5% alumina, .5% chromia; 95% alumina, 3% silica, 2% calcia. Where such an alumina base body is employed best results are generally attained using a groove with a depth of about 30% of the substrate thickness and an angle A of about 60°. If extremely high thermal conductivity is a requirement, beryllia can be used instead of alumina though at the expense of some mechanical strength, beryllia base bodies have a modulus of rupture upwards of about 20,000 p.s.i. The firing temperature used to sinter the ceramic will, of course, depend upon the particular ceramic being used. Such firing temperatures are well-known in the art. Temperatures on the order of 1500 to 1700° C., for example, are commonly used to sinter high alumina compositions.

In the formulation and preparation of the ceramic-organic binder mixture and in the forming of the sheet 12 therefrom it is important to attain optimum uniformity in mixture and density in order to insure even shrinkage during firing. Also, the mixture should be such that the hardness of the sheet is not so great as to create difficulty in the subsequent pressing operation to form the grooves. For optimum ease in forming the grooves and in cutting the sheet, it is desirable that the durometer hardness of the sheet be on the order of 10 to 100 on the Rockwell Shore scale.

Any of a variety of organic plastics can be used as binders. Examples are polyethylene, polyvinyl alcohol and vinylchloride vinylacetate copolymer. Generally a plasticizer should be included to attain the aforedescribed hardness and for ease in forming the sheet. Forming of the sheet can be accomplished by extrusion, casting or other techniques well known in the art. The organic content of the mixture can range from 6 to 30% by weight depending of course upon the particular organic plastic and plasticizer being used. The following compositions are illustrative: ceramic 100 lbs., polyethylene 8 lbs., butyl stearate plasticizer 9 lbs.; ceramic 100 lbs., polyvinyl alcohol 18 lbs., glycerine plasticizer 13 lbs.; ceramic 100 lbs., polyvinylchloride acetate 12 lbs., butyl benzyl phthalate plasticizer 7 lbs.

The pressing tool can be formed of metal or of plastic with hard metal, metal carbide or the like inserts to provide the cutting and groove-forming edges.

And now with reference again to the aforedescribed dimensions for the substrate and the grooves therein, it has been found that if the angle A is greater than 75°, the pressing operation wherein the grooves are formed results in excessive compaction of the ceramic-organic binder mixture immediately adjacent the grooves thereby imparting nonuniformity of density with resultant uneven shrinkage and hence distortion during firing. On the other hand, if the angle is less than 40° it is extremely difficult to maintain quality control, this due to excessive tool wear by reason of the highly abrasive action of the ceramic mixture on the apex portions of the sharp groove-forming ribs. With even slight wear on the apex, a radius is developed which radius is imparted to the groove being formed, and such radius results in difficulties in dividing the substrate into smooth-edged portions. Also, where the groove-forming edges have an angle A of less than 40° it becomes difficult to maintain dimensional tolerances.

As regards the groove depth, the limits set forth have been found to afford adequate strength to insure against premature breakage and yet enable a good clean break, when desired, with resultant smooth-edged substrate portions. In general, the thinner the substrate and the lower the modulus of rupture of the ceramic, the shallower should be the grooves within the percentage limits specified.

Whereas in the preferred embodiment the grooves are formed on only one side of the substrate plate, aligned grooves can, if desired, be formed on opposite sides in which instance the total depth of both such grooves should be within the percentage limits set forth above and the angle A of each groove should be within the limits defined above. The use of grooves on both sides of the plate generally has no advantage, however, and has the disadvantage of requiring extremely precise matched stamping tools, one for each side of the sheet, to assure perfect alignment of the grooves. Any misalignment results in a product which does not provide the desired clean or straight-edged break when the substrate is divided into individual plates.

It will be understood that while the invention has been described with particular reference to preferred embodiments thereof, various modifications may be made all within the scope of the claims which follow.

The embodiments of the invention in which exclusive property or privilege is claimed are defined as follows:

1. A method for manufacturing substrates for printed circuits and the like comprising the sequential steps of: forming a sheet of uniform thickness and density from a mixture of finely divided ceramic and organic binder material, cutting a portion of predetermined size and shape from said sheet while simultaneously pressing said portion so as to form grooves of generally V-shaped cross section thereacross, and then firing said sheet portion to volatilize said organic binder material and sinter said ceramic to form a thin rigid plate, the thickness of said sheet and the pressing thereof prior to firing being such that, after firing, said plate has a thickness of from .005" to .04" with the grooves thereacross having a depth of from 15% to 40% of the plate thickness and with the angle between the sides of each groove being from 40° to 75°.

2. A method as set forth in claim 1 wherein said sheet, prior to firing and during said pressing, has a Rockwell Shore hardness of from 10 to 100.

3. A method as set forth in claim 1 wherein the thickness of said sheet and the pressing thereof prior to firing is such that, after firing, said plate has a thickness of about .01" to .03" with the grooves thereacross having a depth of about 30% of the plate thickness and with the angle between the sides of each groove being about 60°.

References Cited

UNITED STATES PATENTS 2,804,581 8/1957 Lichtgarn.
3,206,322 9/1965 Morgan.

LEWIS H. MYERS, *Primary Examiner.*

D. L. CLAY, *Assistant Examiner.*